US012253666B2

United States Patent
Cusack

(10) Patent No.: US 12,253,666 B2
(45) Date of Patent: Mar. 18, 2025

(54) ATTENUABLE RESISTIVE OPTICAL ISOLATION CIRCUIT AND DEVICE

(71) Applicant: Jon B. Cusack, Holland, MI (US)

(72) Inventor: Jon B. Cusack, Holland, MI (US)

( * ) Notice: Subject to any disclaimer, the term of this patent is extended or adjusted under 35 U.S.C. 154(b) by 143 days.

(21) Appl. No.: 18/185,735

(22) Filed: Mar. 17, 2023

(65) Prior Publication Data

US 2023/0367071 A1    Nov. 16, 2023

Related U.S. Application Data

(60) Provisional application No. 63/364,648, filed on May 13, 2022.

(51) Int. Cl.
| | |
|---|---|
| *G02B 26/02* | (2006.01) |
| *G10H 1/34* | (2006.01) |
| *H10F 55/20* | (2025.01) |
| *H04B 10/80* | (2013.01) |

(52) U.S. Cl.
CPC .......... *G02B 26/023* (2013.01); *G10H 1/348* (2013.01); *H10F 55/20* (2025.01); *H04B 10/802* (2013.01)

(58) Field of Classification Search
CPC ...... G02B 26/023; H01L 31/16; H04B 10/802
See application file for complete search history.

(56) References Cited

FOREIGN PATENT DOCUMENTS

| CA | 3102945 A1 | * 12/2019 | ............. A61B 5/002 |
|---|---|---|---|
| GB | 2546263 A | * 7/2017 | ........... H04B 1/3838 |

* cited by examiner

*Primary Examiner* — Georgia Y Epps
*Assistant Examiner* — Don J Williams
(74) *Attorney, Agent, or Firm* — Atwater Law & Intellectual Property, PLLC; David Stuart Atwater

(57) ABSTRACT

An electrical optical isolation circuit and device characterized by a light source, a light-sensitive sensor, and a variable shield between the light source and the light-sensitive sensor, the variable shield being adjustable after assembly of the electrical circuit, and the variable shield adjustment providing attenuation of the electrical circuit output.

10 Claims, 4 Drawing Sheets

ATTENUABLE RESISTIVE OPTICAL ISOLATION CIRCUIT AND DEVICE

REFERENCE TO RELATED APPLICATIONS

This application claims the benefit under 35 U.S.C. § 119(e) on U.S. Provisional Application No. 63/364,648 entitled "ATTENUABLE RESISTIVE OPTICAL ISOLATION CIRCUIT AND DEVICE," filed on May 13, 2022, by Jon B. Cusack, the entire disclosure of which is incorporated by reference.

BACKGROUND

The present disclosure generally relates to optical isolation circuits and devices. In particular, the present disclosure relates to attenuable resistive optical isolation circuits and devices.

In general, optical isolation circuits, also referred to as optocouplers, are useful in many applications such as but not limited to isolation sections of a circuit, where the circuit's input signal has amplitude or characteristics that are incompatible with the required output function. For instance, optical isolation circuits are used in hospitals to protect a human subject from shock when the human subject is interfaced with monitoring instruments or other electrical devices. Other applications scenarios include isolating low-current output control or signal circuits from noisy input power supply circuits or higher current motor circuits.

Optical isolation is typically achieved by optocouplers that use light to transmit information across a transmission medium. Typically, a light source such as a light emitting diode (LED) transmits information to a light-sensitive receiver or a photoreceptor (e.g., a transistor, or light-dependent resistor).

Existing optocouplers suffer from problems with regard to their longevity, initial performance, degraded performance over time, and exterior light source noise influencing the light-sensitive receiver. For instance, because LEDs vary in initial light intensities, employing an optical isolator generally requires calibration of the isolator before assembly. Such a calibration may involve a measurement of the LED output and a corresponding selection and assembly of a particular resistor to achieve the desired LED output characteristics. Such a calibration increases assembly complexity and labor cost. Further, because LEDs may wear out over time, optical isolation typically requires periodic compensation and safeguarding to ensure satisfactory operability and performance over the life of the optical isolator. Further, exterior light sources can penetrate the interior of the optocoupler and add undesired noise to the light-sensitive receiver. Current methods and devices do not address these problems satisfactorily and at low cost.

Therefore, there is a need for an improved optical isolation circuit and device that solves at least the above identified problems. It would also be desirable to provide a reliable, long-life optocoupler which can be manufactured, implemented, and adjusted easily and at low cost for the circuit and device applications to achieve consistent and satisfactory performance over a longer time period.

SUMMARY OF THE INVENTION

The disclosure is an attenuable resistive optical isolation device which addresses the above-mentioned problems of labor cost, manufacturing cost, meeting initial output specifications, maintaining output specifications, and minimizing exterior light noise throughout the life of the product. The disclosure consists of a housing, which contains a light source, a light-sensitive sensor, an adjustable barrier located between the light source and the light-sensitive sensor. The adjustable barrier precisely controls the amount of light reaching the light-sensitive sensor. The housing also has an optional covering that blocks exterior light from reaching the light-sensitive sensor. The adjustable barrier can be adjusted quickly and easily without disassembling the device. If the device is part of a larger product, the adjustable barrier can also be adjusted quickly and easily without disassembling the larger product.

BRIEF DESCRIPTION OF DRAWINGS

The accompanying drawings incorporated in this disclosure constitute a part of the disclosure. The drawings illustrate exemplary embodiments of the disclosed methods and systems in which like reference numerals refer to the same parts throughout the different drawings. Components in the drawings are not necessarily to scale. Instead, the emphasis is to clearly illustrate the principles of the disclosure. Some drawings may indicate the components using block diagrams and may not represent the internal circuitry of each component. It will be appreciated by those skilled in the art that disclosure of such drawings includes the disclosure of electrical components, electronic components, or circuitry commonly used to implement such components. These and other features, aspects, and advantages of the present disclosure will become better understood with regard to the following and ensuing description, appended claims, and accompanying drawings where:

DETAILED DESCRIPTION

Figure 1A:
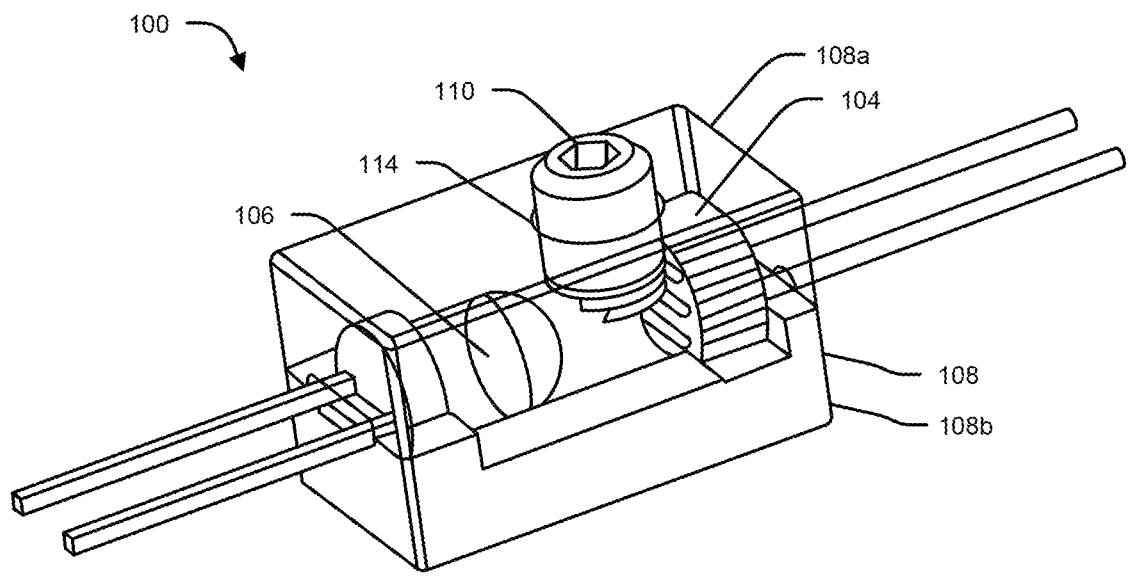
FIGS. 1A and 1B illustrate a perspective view of an embodiment of an attenuable resistive optical isolation device according to one aspect of the present disclosure.

In the following description, for the purposes of explanation, various specific details are set forth in order to provide a thorough understanding of embodiments of the present disclosure. It will be apparent, however, that embodiments of the present disclosure may be practiced without these specific details. Several described features can each be used independently of one another or with any combination of other features. An individual feature may not address all of the problems discussed above or might address only some of the problems discussed above. Some of the problems discussed above might not be fully addressed by any of the described features.

The ensuing description provides exemplary embodiments only and is not intended to limit the scope, applicability, or configuration of the disclosure. Rather, the ensuing description of the exemplary embodiments will provide those skilled in the art with an enabling description for implementing an exemplary embodiment. Various changes may be made in the function and arrangement of elements without departing from the spirit and scope of the present disclosure.

Specific details are given in the following description to provide a thorough understanding of the embodiments. However, it will be understood by one of ordinary skill in the art that the embodiments may be practiced without these specific details. For example, circuits, systems, networks, processes, and other components may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Also, it is noted that individual embodiments may be described as a process which is depicted as a flowchart, a flow diagram, a data flow diagram, a structure diagram, or a block diagram. Although a flowchart or a method may describe the operations as a sequential process, many of the operations can be performed in parallel or concurrently. In addition, the order of the operations may be re-arranged. A process is terminated when its operations are completed but could have additional steps not included in a figure. A process may correspond to a method, a function, a procedure, a subroutine, a subprogram, and anything similar. When a process corresponds to a function, its termination can correspond to a return of the function to the calling function or the main function.

In this document, the word "exemplary" and/or "demonstrative" is used to mean serving as an example, instance, or illustration. For the avoidance of doubt, the subject matter disclosed is not limited by such examples. Any aspect or design described as "exemplary" and/or "demonstrative" is not necessarily to be construed as preferred or advantageous over other aspects or designs, nor is it meant to preclude equivalent exemplary structures and techniques known to those of ordinary skill in the art. To the extent that the terms "includes," "has," "contains," and other similar words are used in either the detailed description or the claims, such terms are intended to be inclusive, in a manner similar to the term "comprising" as an open transition word, without precluding any additional or other elements.

Reference throughout this specification to "one embodiment," "an embodiment," "an instance," or "one instance" means that a particular feature, structure, or characteristic described in connection with the embodiment is included in at least one embodiment of the present disclosure. The appearances of the phrases "in one embodiment" or "in an embodiment" in various places throughout this specification are not necessarily all referring to the same embodiment. Further, the particular features, structures, or characteristics may be combined in any suitable manner in one or more embodiments.

The terminology used is for the purpose of describing particular embodiments only and is not intended to be limiting of the present disclosure. The singular forms "a," "an," and "the" are intended to include the plural forms as well, unless the context clearly indicates otherwise. The terms "comprises" and/or "comprising," specify the presence of stated features, integers, steps, operations, elements, and/or components, but do not preclude the presence or addition of one or more other features, integers, steps, operations, elements, components, and/or groups of these. The term "and/or" includes any and all combinations of one or more of the associated listed items.

The following terms may be used in the disclosure and may include the meaning as per the indicative definition provided below.

The terms "photoreceptor," "photosensor," "light sensitive receiver," "optical receiver," or "photocell" include all devices and circuits that are configured to operate (e.g., conduct, or vary resistance) based at least on incident light from a light source.

The term "light source" includes all devices and circuits that are capable of emitting light towards the photoreceptor in the context of optical isolation of circuits, optocouplers, optical isolation devices, and the like.

The term "opto-" and "optical" have been interchangeably used to mean "associated with light."

The term "attenuation" refers to an increase or decrease in the signal strength or intensity based on an adjustment of an adjustable barrier described in this disclosure. The term "attenuable" refers to an ability to achieve attenuation. Attenuation may also refer to an increase or decrease in the magnitude of electrical output of the device or the circuit based on adjustments made to the adjustable barrier. The "signal" may refer to an optical signal from the light source or the electric output signal from the device or the circuit, for instance.

The terms "optocouplers" and "optical isolation devices" have been used interchangeably to refer to a device used for optical isolation of circuits using the disclosed adjustable attenuation.

The term "assembly" refers to the process of integrating and installing one or more components in the device to create a unit that has a pre-defined function of optical isolation. It also refers to a state of packaging of the one or more components or circuits into a unit that is sold and used as such without any disassembly or dismantling.

The term "circuit" refers to an arrangement and integration of one or more electrical or electronic circuit elements such as diodes, resistors, transistors, and anything similar for providing an output voltage based at least on an input voltage. The integration may include mounting or soldering the one or more electrical or electronic circuit elements on a printed circuit board for a specific application.

The terms "barrier" and "shield" are interchangeably used to include all embodiments of mechanically-operated or electrically-operated barriers that can be adjusted after the assembly of the optical isolation device.

The term "adjustable" refers to the property of the disclosed embodiments of the barrier in the device that allows for a manipulation of the magnitude of attenuation of signals using the barrier. Such manipulation includes a set of steps or actions, either manual or otherwise, that results in a change in mechanical disposition (in case of a mechanical barrier) or an optical property (in case of a glass barrier) or a combination of mechanical disposition and optical property in the device. Such a manipulation leads to varying the magnitude of attenuation provided by the optical isolation circuit and device.

In general, optocouplers and optical isolation devices find use in multiple applications, for instance, in guitar sound effect devices, telephone repeaters, telephonic communications, shunt input controls, series input controls, gating and muting circuits, speaker power limiting circuits, high-frequency amplifiers, and control circuits. As described earlier, existing devices suffer from problems such as degraded performance and undesirable output characteristics over time.

The disclosed embodiments of the attenuable resistive optical isolation circuit and device propose solutions to address the above-mentioned problems before and after the assembly of the circuit and device. For example, the disclosed embodiments provide for a feature to adjust the amount of light incident on the light sensitive receiver after the initial assembly is completed or any time in the future, with a minimum of manufacturing and labor costs. Embodiments of an electrical optical isolation circuit and device are disclosed. The electrical optical isolation circuit and device is characterized by a light source, a light-sensitive sensor, and a variable shield between the light source and the light-sensitive sensor, the variable shield being adjustable after assembly of the circuit, and the variable shield adjustment providing attenuation of the electrical circuit output.

Such an adjustment or attenuation is achieved by introducing an adjustable barrier in the device in such a manner that the adjustable barrier can be easily manipulated after the assembly to precisely control the amount of light received by the photoreceptor or the electrical output of the device.

In an embodiment, the adjustable barrier may be an internal physical barrier. For instance, the barrier may be a set screw, a rotating screen, a sliding screen, or a fixed screen with transparency changing property. In an embodiment, the adjustment is effectuated by changing one or more properties associated with the adjustable barrier after the assembly of the device or the circuit. For instance, the adjustment can be implemented by changing a mechanical orientation or disposition of the adjustable barrier with respect to the fixed components of the device. In case of a set screw as a physical adjustable barrier, the attenuation or adjustment is implemented by rotating the set screw in a clockwise or anti-clockwise direction about the screw axis. In another embodiment, the adjustment is effectuated by changing the optical properties of the adjustable barrier after the assembly. For instance, the adjustment can be implemented by electrically activating a liquid crystal display (LCD) screen inserted between the light source and the photoreceptor. In an embodiment, the barrier may be a housing attenuation barrier. For instance, a common construction for conventional optocouplers involves an LED and a photocell placed on the same central axis and in immediate proximity to each other. Further, the LED and the photocell are wrapped in several housings, including but not limited to heat shrink tubing, plastic housings, glass housings, and metal housings. The disclosed embodiments propose modifications of the housing that include slidably mounting the LED and the photocell in the housing in such a manner that the relative position between the LED and the photocell can be varied after the assembly. In an embodiment, the LED and the photocell can be slidably mounted to allow for an off-axis movement after the assembly. In an embodiment, the attenuation or adjustment may be implemented using any combination of the above-described embodiments.

Figure 1B:
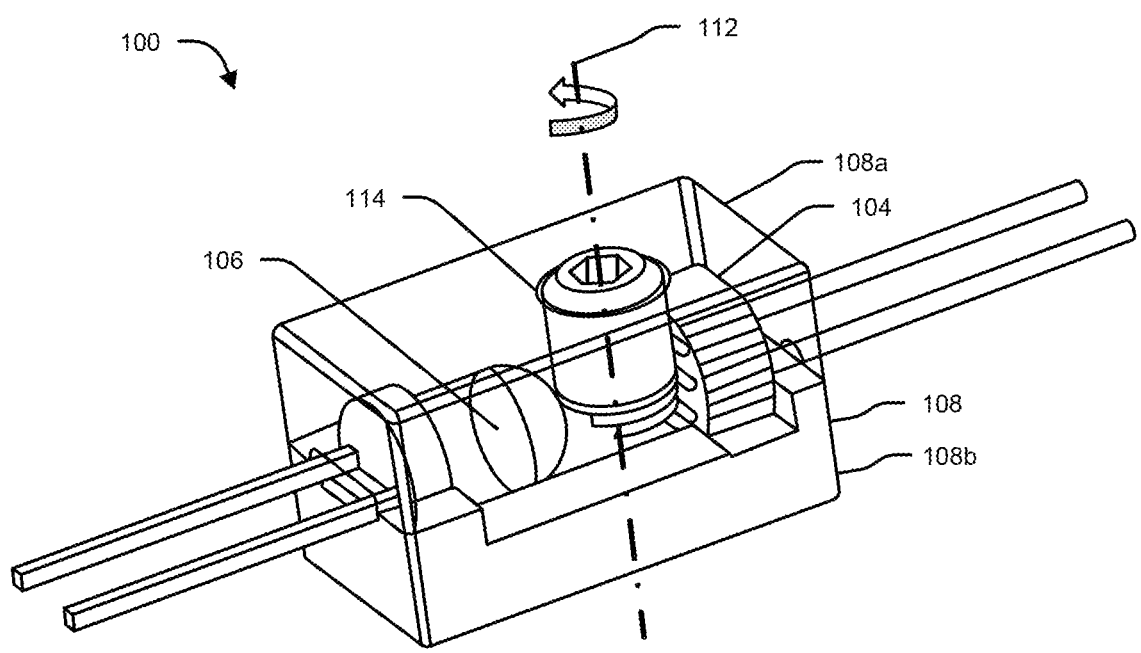

FIGS. 1A and 1B illustrate schematic perspective views of the attenuable resistive optical isolation device 100 (referred to as "device 100") according to one aspect of the disclosure. As shown, the device 100 includes a photoreceptor 104 and a light source 106 in a first housing 108. In an embodiment, the light source 106 is installed at one end (e.g., left) of the first housing 108 and the photoreceptor 104 is installed at the opposite end (e.g., right) of the first housing 108. In an embodiment, the photoreceptor 104 and the light source 106 are installed at a pre-determined distance apart from each other. The device 100 further includes an adjustable barrier or attenuation component 110 ("adjustable barrier 110") inserted between the light source 106 and the photoreceptor 104. In the embodiment shown in FIGS. 1A and 1B, the adjustable barrier 110 (e.g., a set screw) is inserted in a threaded hole 114 that is provided in the first housing 108.

The light source 106 may include any light emitting source such as but not limited to an LED, an incandescent bulb, or a fluorescent lamp. The photoreceptor 104 may include any optical sensor, detector, or receptor such as but not limited to a photodiode, a photo transistor, or a photocell.

In an embodiment, the first housing 108 may include two pieces made of injection molded or printed plastic, including an upper first housing 108a and a lower first housing 108b. Further, the upper first housing 108a and the lower first housing 108b may optionally include mating features allowing the upper first housing 108a and the lower first housing 108b to lock together. It may be noted by those skilled in the art that disclosed embodiments may use other forms, types of housings, mating features, and configurations without departing from the scope of the ongoing description.

The adjustable barrier 110 allows the device 100 to be calibrated or attenuated after the device 100 is initially assembled or in the future. For example, if the device 100 has initial performance outside of intended specifications, the performance of the light source 106 or the performance of the photoreceptor 104 degrade over time, or any environmental changes occur, the adjustable barrier 110 allows calibration to compensate for such inaccuracies, degradations, or changes and bring the device 100 within an acceptable range of the intended specifications.

In an embodiment, the adjustable barrier 110 may be one of but is not limited to a rotating screen, a sliding screen, or a fixed screen with transparency changing properties. The adjustment or attenuation is achieved by changing one or more properties associated with the adjustable barrier 110 after the assembly of the device 100. For instance, the adjustment can be implemented by changing a mechanical orientation of the adjustable barrier 110 with respect to the fixed components of the device 100. In the embodiment shown in FIGS. 1A and 1B, the attenuation or adjustment is achieved by rotating the set screw in a clockwise or anti-clockwise direction about the screw axis 112.

In an embodiment, the adjustment can be achieved by changing the optical properties of an optical barrier used as the adjustable barrier 110. For instance, the adjustment can be implemented by electrically activating a liquid crystal display (LCD) screen inserted between the light source 106 and the photoreceptor 104. In an embodiment, the optical barrier may be one of but is not limited to a smart glass screen or a switchable glass screen made of a material capable of changing its optical properties (e.g., transparency, opacity). The attenuation or adjustment is achieved by adjusting the electric current that varies the optical properties of the glass screen. For example, the electric current could be adjusted by a manually or otherwise adjustable variable resistor.

In an embodiment, the adjustable barrier 110 may be implemented as a housing-based attenuation barrier. For example, the light source 106 and the photoreceptor 104 may be slidably installed at the respective ends of the first housing 108. For example, the first housing 108 may be formed of malleable material and allow bending. The adjustment or attenuation may be achieved by controlling the relative distance, offset, or angle between the light source 106 and the photoreceptor 104. Either or both of the light source 106 and the photoreceptor 104 may be moved relative to each other or the device axis (not shown). In an embodiment, the light source 106 and the photoreceptor 104 may be slidably or angularly installed to allow for movement away from the device axis. In an embodiment, the attenuation or adjustment may be implemented using any combination of the above-described embodiments, including for example slidably installed light source 106, slidably installed photoreceptor 104, and a slidably installed adjustable barrier.

Figure 2:
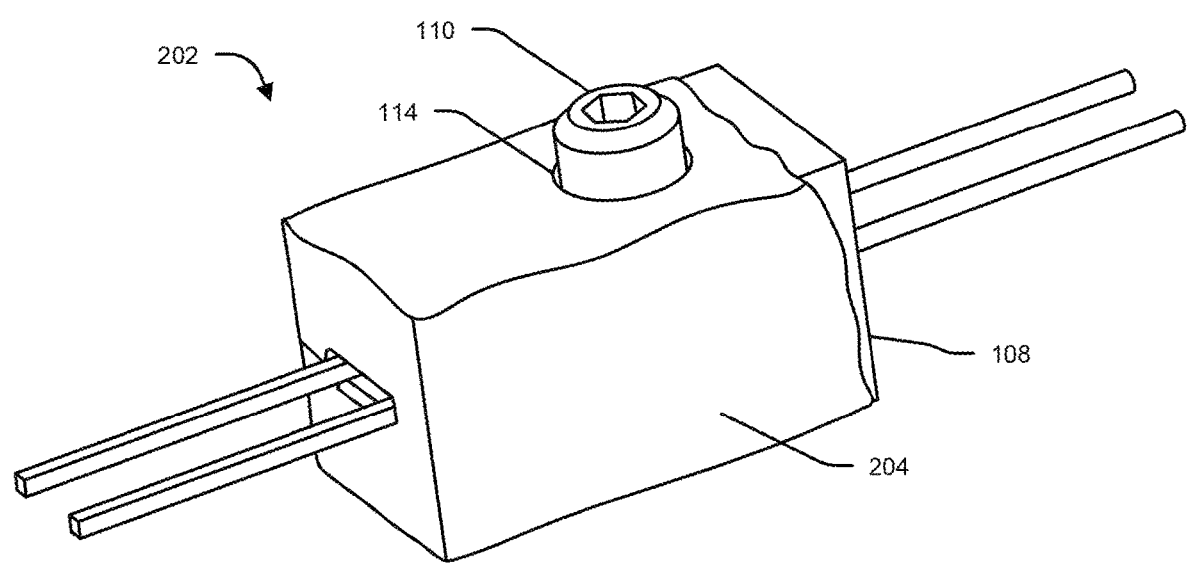
FIG. 2 illustrates another perspective view of an embodiment of an attenuable resistive optical isolation device according to one aspect of the present disclosure.

FIG. 2 illustrates a perspective view of another attenuable resistive optical isolation device 202 according to one aspect of the present disclosure. As shown in this best mode embodiment, the first housing 108 is wrapped in a second housing 204 before inserting the adjustable barrier 110 through the threaded hole 114 of the first housing 108. The second enclosure 204 may be one of but is not limited to a tube, a physical wrapping, or heat shrink tubing.

Figure 3A:
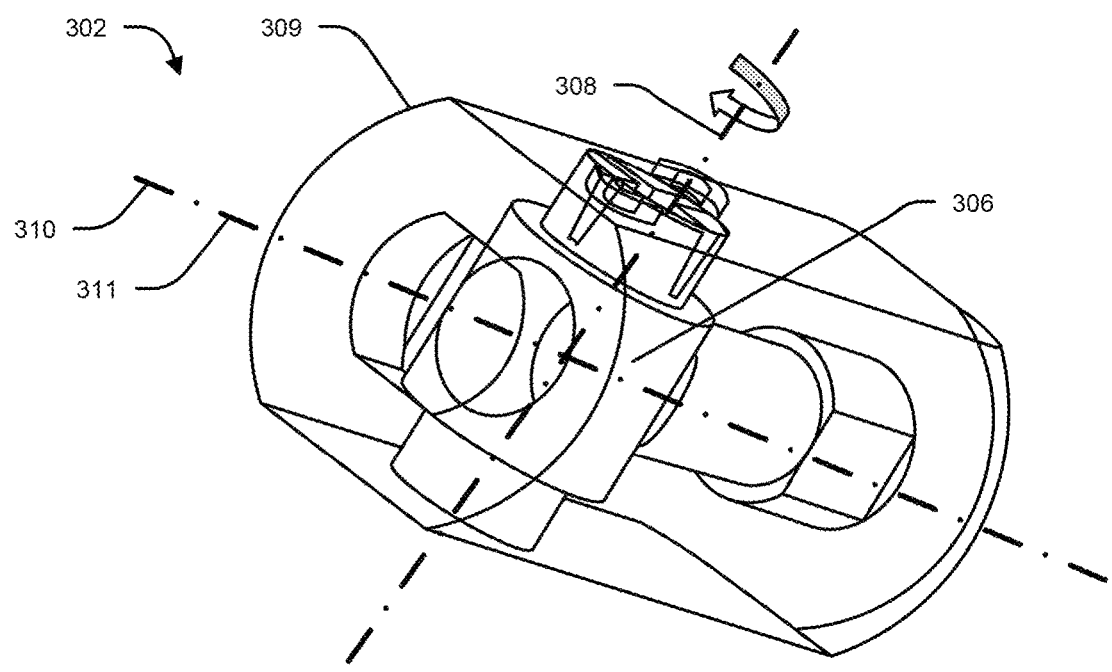
FIGS. 3A and 3B illustrate a perspective view of an embodiment of an attenuable resistive optical isolation device according to another aspect of the present disclosure.
Figure 3B:
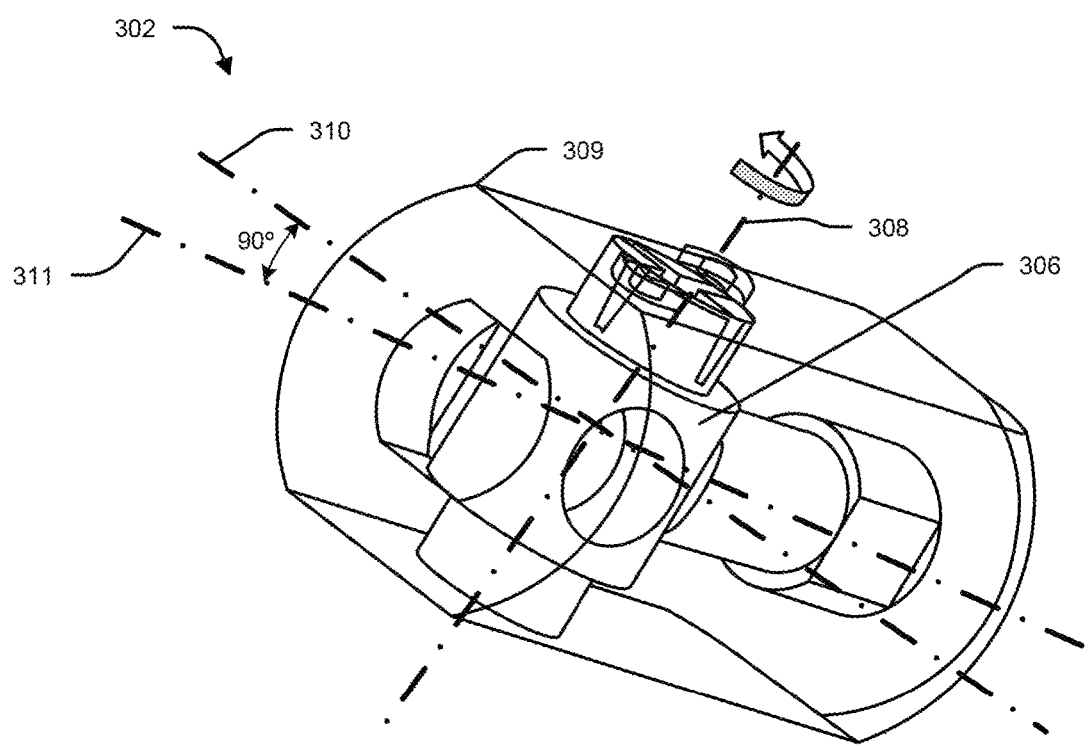

FIGS. 3A and 3B illustrate perspective views of yet another embodiment of attenuable resistive optical isolation device 302 ("device 302") according to another aspect of the present disclosure. In the embodiment shown, a third housing 309 has device longitudinal axis 311, the adjustable barrier is a rotatable cylinder 306 having a bore or through hole with a bore axis 310. The bore axis 310 is oriented perpendicular to the rotatable cylinder axis 308. In FIG. 3A, the photoreceptor 104 and light source 106 are not shown but are located on the device longitudinal axis 311 and on opposing sides of the rotatable cylinder 306. FIG. 3A shows an orientation of the device 302 in which the device longitudinal axis 311 and the bore axis 310 are aligned and coincident with each other. FIG. 3B shows an orientation of the device 302 in which the device longitudinal axis 311 is perpendicular to the bore axis 310. Varying amounts of attenuation are achieved by rotating the rotatable cylinder 306 in a clockwise or anticlockwise direction about the rotatable cylinder axis 308 after the assembly of the device 302.

Figure 4:
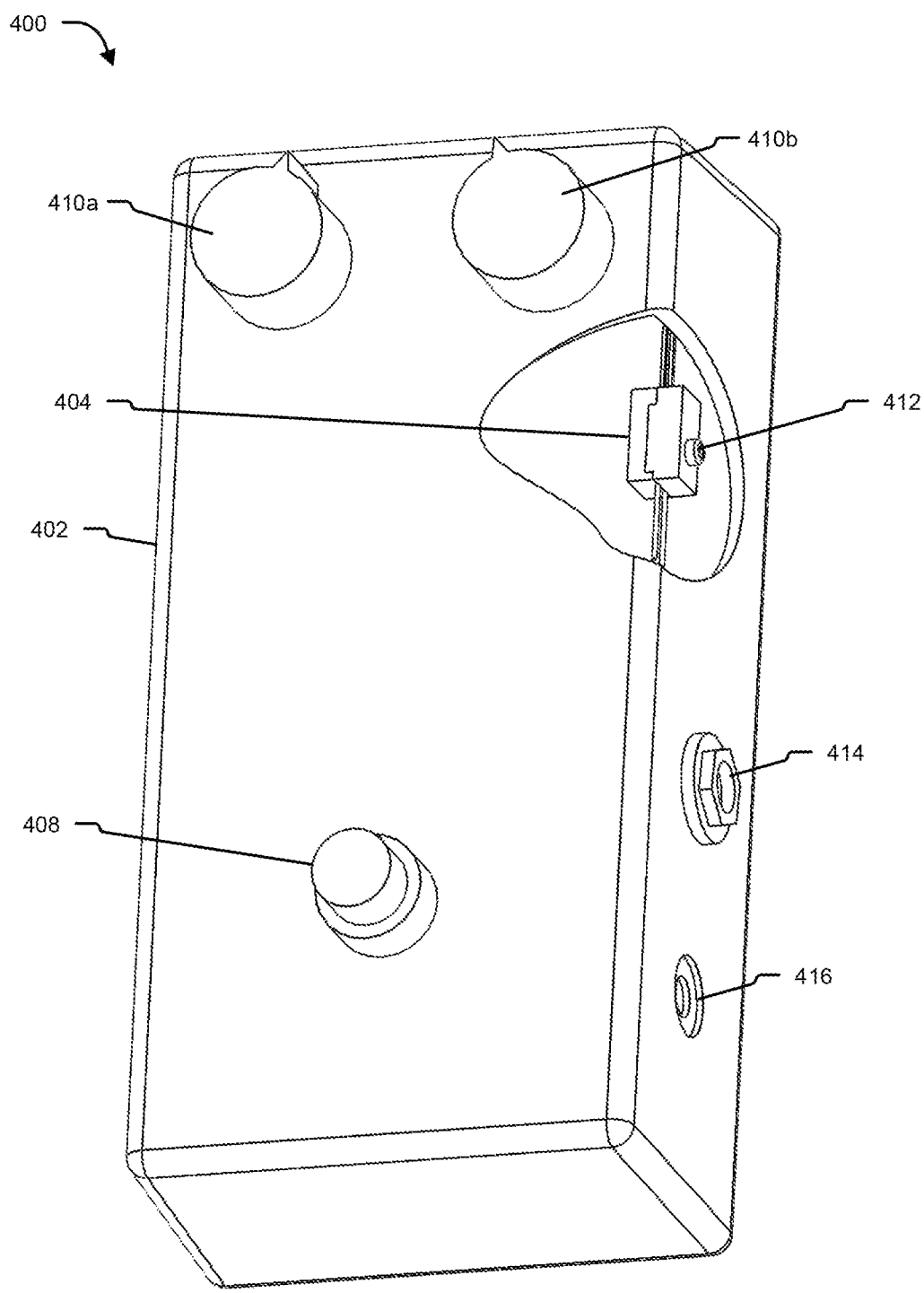
FIG. 4 illustrates a perspective view of a device implementing an embodiment of an attenuable resistive optical isolation device according to an aspect of the present disclosure.

FIG. 4 illustrates a top perspective view of a guitar pedal device 400 implementing an attenuable resistive optical isolation device 404 ("device 404") according to an aspect of the present disclosure. As shown, the guitar pedal device 400 includes a case 402 that houses an attenuable resistive optical isolation device 404 with an adjustable control 412 accessible from the outside of the case 402. Generally, the guitar pedal device 400 further includes a user control bypass switch 408, one or more user control knobs 410, a sound output port 414, and a power connection port 416, all on the outer surfaces of the case 402.

It may be appreciated that the adjustable control 412 may be implemented as any mechanism that controls or adjusts the attenuation of the device 404 irrespective of the type of adjustable barriers used. For instance, the adjustable control 412 can be a knob mounted on the case 402 accessible to a user on the front surface of the device 400. The knob for adjustable control 412 can be rotated to achieve the attenuation or adjustment required. For instance, if the cylinder 306 is used as the adjustable barrier for the embodiment shown in FIG. 4, the knob for adjustable control 412 can be rotated from an initial position with no attenuation to a final position with maximum attenuation. In an embodiment, complete attenuation corresponds to a complete optical isolation and may result in a "off" or "isolated" state of the device 400. In an embodiment, the adjustable control 412 may be a depression switch which when pressed by a user, results in a partial, stepped, or complete attenuation of the electric output of the device 404.

Embodiments of a method for providing an attenuable resistive optical isolation device are disclosed.

In an embodiment, the method of providing an attenuable resistive optical isolation device includes slidably fixing a light source (e.g., 106) at one end and a photoreceptor (e.g., 104) at the other end of a first housing (e.g., 108). The method further includes providing a threaded hole on the first housing located between the one end and the other end. The method further includes wrapping the first housing with the light source and the photoreceptor in a second housing (e.g., 204) such as but not limited to a tube, a physical wrapping, or a heat shrink tube. The method further includes rotatably inserting an adjustable barrier (e.g., 110) through the threaded hole and rotating the physical barrier to control or adjust the amount of light incident on the photoreceptor. In an alternative embodiment, the method includes mounting an optical barrier (e.g., LCD screen or a smart glass screen) in the first housing between the light source and the photoreceptor. Accordingly, the electric input to the optical barrier can be controlled to adjust or control the amount of light incident on the photoreceptor. In an embodiment, the output of the device can be controlled or attenuated by moving the light source and/or the photoreceptor relative to each other along the device axis. In another embodiment, the output of the device can be controlled or attenuated by performing an off-axis movement of the light source and/or the photoreceptor.

The step of wrapping or providing a second housing ensures a light barrier to external light leaking into the circuit or the device assembly. The second housing also provides a sealing surface to block light from entering the assembly via the set screw threads, a moisture barrier, and a surface to provide product information, including for example wiring instructions.

In an embodiment, the adjustable barrier is a set screw. In another embodiment, the adjustable barrier is a rotatable cylinder (e.g., 306) having a bore (or through hole) with a bore axis oriented perpendicular to an axis of the rotatable cylinder. In another embodiment, the adjustable barrier is a rotating screen movably disposed between the light source and the photoreceptor in the first housing. Other barriers and attenuation devices are also possible, including an electrically-operated attenuation device such as but not limited to a Liquid Crystal Display (LCD) screen, or a third housing in the first housing that adjusts length to attenuate the light being delivered across the circuit to the photoreceptor as described earlier. For example, the third housing can allow movement of a component (e.g., the light source or the photoreceptor) off-axis to attenuate the light being delivered across the circuit. In an embodiment, one or more light sources, one or more barriers, and one or more photoreceptors may be assembled in the first housing without departing from the scope of the ongoing description.

There are numerous advantages of the disclosed embodiments of the attenuable resistive optical isolation device. Some but not all of the advantages are listed in this disclosure. For instance, the device can be efficiently manufactured by saving the manufacturing time associated with calibrating the optocoupler before assembly and choosing a proper resistor to achieve the desired output characteristics. Further, the disclosed embodiments allow calibration of the optocoupler after assembly which increases the life of the device. The individual components are inexpensive in comparison to the active feedback circuits. Further, the disclosed embodiments allow a lifetime adjustability feature by allowing the calibration of optocoupler over time as the light source output decays or degrades. Such calibration may be performed without direct access to an internal element, for example, a trimmer potentiometer resistor located on an internal circuit board. Further, the disclosed adjustable barriers have low manufacturing cost and are effective light barriers to minimize any environmental light noise reaching the photoreceptor.

While considerable emphasis has been placed on certain embodiments, it will be appreciated that many embodiments can be made and that many changes can be made in the described embodiments without departing from the principles of the disclosure. These and other changes in the preferred embodiments will be apparent to those skilled in the art from this disclosure, where it is distinctly understood that the foregoing descriptive matter is to be interpreted merely as illustrative and not as a limitation.

Although a very narrow claim is presented, it should be recognized that the scope of this disclosure is much broader than presented by the claim such as the features specified. It is intended that broader claims will be submitted in an application that claims the benefit of priority from this application.

Insofar as the description above and the accompanying drawings disclose any additional subject matter that is not within the scope of the single claim below, the disclosures are not dedicated to the public and the right to file one or more applications to claim such additional disclosures is reserved.

What is claimed is:

1. A device for optical isolation, comprising:
   a) a first housing comprising:
      i) an outside;
      ii) an inside; and
      iii) at least one access hole connecting the outside to the inside;
   b) at least one light source, capable of transmitting a light signal in the inside of the housing;
   c) at least one photoreceptor located as to receive the light signal from the light source; and
   d) at least one adjustable barrier, the adjustable barrier being capable to block all, some, or none of the light signal from reaching the photoreceptor, the adjustable barrier selected from the group consisting of i) an adjustable barrier that has external threads and the access hole has internal threads that mate with the adjustable barrier external threads, and ii) an adjustable barrier that rotates about the adjustable barrier's main axis and the adjustable barrier includes a bore hole with the bore hole axis located off-axis from the adjustable barrier main axis.

2. The device of claim 1 further comprising
   a) a second housing surrounding the first housing, the second housing being capable of blocking light from the outside of the first housing from reaching the inside of the first housing.

3. The device of claim 2 wherein
   a) the adjustable barrier is cylindrical.

4. The device of claim 3 wherein
   a) the adjustable barrier is accessible and adjustable from the outside of the first housing.

5. The device of claim 2 wherein
   a) the adjustable barrier is accessible and adjustable from the outside of the first housing.

6. The device of claim 1 wherein
   a) the adjustable barrier is cylindrical.

7. The device of claim 1 wherein
   a) the adjustable barrier is accessible and adjustable from the outside of the first housing.

8. A guitar pedal effect device and/or music sound effect device comprising:
   a) a device for optical isolation, comprising:
      i) a first housing comprising:
         (1) an outside;
         (2) an inside; and
         (3) at least one access hole connecting the outside to the inside;
      ii) at least one light source, capable of transmitting a light signal in the inside of the housing;
      iii) at least one photoreceptor located as to receive the light signal from the light source;
      iv) at least one adjustable barrier being capable of blocking all, some, or none of the light signal from reaching the photoreceptor, wherein the adjustable barrier is accessible and adjustable from the outside of the first housing; and
      v) a second housing surrounding the first housing, the second housing being capable of blocking light from the outside of the first housing from reaching the inside of the first housing.

9. The device of claim 8 wherein
   a) the adjustable barrier has external threads and the access hole has internal threads that mate with the adjustable barrier external threads.

10. The device of claim 8 wherein
    a) the adjustable barrier rotates about the adjustable barrier's main axis and the adjustable barrier includes a bore hole with the bore hole axis located off-axis from the adjustable barrier main axis.

* * * * *